United States Patent
Iwano et al.

(10) Patent No.: US 9,982,177 B2
(45) Date of Patent: May 29, 2018

(54) SLURRY, POLISHING FLUID SET, POLISHING FLUID, AND SUBSTRATE POLISHING METHOD USING SAME

(75) Inventors: Tomohiro Iwano, Hitachi (JP);
Hirotaka Akimoto, Hitachi (JP);
Takenori Narita, Hitachi (JP);
Tadahiro Kimura, Hitachi (JP);
Daisuke Ryuzaki, Kokubunji (JP)

(73) Assignee: HITACHI CHEMICAL COMPANY, LTD, Tokyo (JP)

(*) Notice: Subject to any disclaimer, the term of this patent is extended or adjusted under 35 U.S.C. 154(b) by 0 days. days.

(21) Appl. No.: 13/575,078

(22) PCT Filed: Jan. 20, 2011

(86) PCT No.: PCT/JP2011/050991
§ 371 (c)(1),
(2), (4) Date: Jul. 25, 2012

(87) PCT Pub. No.: WO2011/111421
PCT Pub. Date: Sep. 15, 2011

(65) Prior Publication Data
US 2012/0322346 A1     Dec. 20, 2012

(30) Foreign Application Priority Data
Mar. 12, 2010 (JP) ................ P2010-056281

(51) Int. Cl.
*C09K 3/14* (2006.01)
*B24B 37/04* (2012.01)
(Continued)

(52) U.S. Cl.
CPC .......... *C09K 3/1463* (2013.01); *B24B 37/044* (2013.01); *C09G 1/02* (2013.01); *H01L 21/31053* (2013.01)

(58) Field of Classification Search
None
See application file for complete search history.

(56) References Cited

U.S. PATENT DOCUMENTS 3,097,083 A    7/1963   Silvernail
3,123,452 A    3/1964   Harris et al.
(Continued)

FOREIGN PATENT DOCUMENTS

CN    1384170 A    12/2002
CN    1457506      11/2003
(Continued)

OTHER PUBLICATIONS

Communication dated Feb. 11, 2014, in connection with Chinese Patent Application No. 201180005050.3, 22 pages;Chinese Patent Office, China.
(Continued)

*Primary Examiner* — Jennifer A Smith
*Assistant Examiner* — Ross J Christie
(74) *Attorney, Agent, or Firm* — Fitch, Even, Tabin & Flannery, LLC

(57) ABSTRACT

A slurry includes abrasive grains and water, wherein the abrasive grains include tetravalent cerium hydroxide particles and produce light transmittance of at least 50%/cm for light with a wavelength of 500 nm in an aqueous dispersion with the content of the abrasive grains adjusted to 1.0 mass %. A polishing liquid includes abrasive grains, an additive and water, wherein the abrasive grains include tetravalent cerium hydroxide particles and produce light transmittance of at least 50%/cm for light with a wavelength of 500 nm in an aqueous dispersion with the content of the abrasive grains adjusted to 1.0 mass %.

25 Claims, 3 Drawing Sheets

(51) Int. Cl.
*H01L 21/3105* (2006.01)
*C09G 1/02* (2006.01)

(56) References Cited

U.S. PATENT DOCUMENTS

| | | | |
|---|---|---|---|
| 5,529,969 | A | 6/1996 | Bonneau et al. |
| 5,908,800 | A | 6/1999 | Bonneau et al. |
| 6,420,269 | B2 | 7/2002 | Matsuzawa et al. |
| 6,440,856 | B1 | 8/2002 | Bessho et al. |
| 6,589,496 | B1 | 7/2003 | Yabe et al. |
| 6,786,945 | B2 | 9/2004 | Machii et al. |
| 2002/0016060 | A1 | 2/2002 | Matsuzawa et al. |
| 2004/0065022 | A1* | 4/2004 | Machii et al. .......... 51/309 |
| 2005/0028450 | A1 | 2/2005 | Xu et al. |
| 2005/0074384 | A1 | 4/2005 | Yabe et al. |
| 2005/0255693 | A1 | 11/2005 | Liu et al. |
| 2006/0278614 | A1 | 12/2006 | Wang et al. |
| 2006/0289826 | A1 | 12/2006 | Koyama et al. |
| 2007/0166216 | A1 | 7/2007 | Chinone et al. |
| 2007/0181535 | A1 | 8/2007 | De Rege Thesauro et al. |
| 2007/0251270 | A1 | 11/2007 | Miyatani et al. |
| 2009/0318063 | A1 | 12/2009 | Misra |
| 2010/0107509 | A1 | 5/2010 | Guiselin |
| 2011/0006251 | A1 | 1/2011 | Chinone et al. |
| 2011/0275217 | A1 | 11/2011 | Satou et al. |
| 2011/0275285 | A1 | 11/2011 | Satou et al. |
| 2012/0299158 | A1* | 11/2012 | Shinoda et al. .......... 257/618 |

FOREIGN PATENT DOCUMENTS

| | | |
|---|---|---|
| CN | 1524917 A | 9/2004 |
| CN | 1610963 A | 4/2005 |
| CN | 1746255 A | 3/2006 |
| CN | 1290162 C | 12/2006 |
| CN | 1935927 A | 3/2007 |
| CN | 1948418 A | 4/2007 |
| CN | 101395097 A | 3/2009 |
| CN | 101611476 A | 12/2009 |
| CN | 101649182 A | 2/2010 |
| CN | 102408836 A | 4/2012 |
| EP | 0541158 A1 | 5/1993 |
| EP | 0992456 A1 | 4/2000 |
| EP | 1 369 906 A1 | 12/2003 |
| JP | 8-22970 | 1/1996 |
| JP | 9-270402 | 10/1997 |
| JP | 10-106994 | 4/1998 |
| JP | 2002-241739 | 8/2002 |
| JP | 2004-155913 A | 6/2004 |
| JP | 2006-182604 | 7/2006 |
| JP | 2006-249129 | 9/2006 |
| JP | 2006-249129 A | 9/2006 |
| JP | 2008-199043 | 8/2008 |
| JP | 2008-290183 | 12/2008 |
| JP | 2009-10402 | 1/2009 |
| JP | 2009-010402 A | 1/2009 |
| JP | 2009-67627 | 4/2009 |
| JP | 2009-212378 | 9/2009 |
| JP | 2009290188 A * | 12/2009 |
| JP | 2010-16064 | 1/2010 |
| JP | 2010-505735 | 2/2010 |
| JP | 2010-141288 | 6/2010 |
| JP | 2010-153781 | 7/2010 |
| JP | 2010-153782 A | 7/2010 |
| JP | 2010-158747 | 7/2010 |
| JP | 2011-151405 A | 8/2011 |
| JP | 2012-084906 | 4/2012 |
| TW | 201132749 A1 | 10/2011 |
| WO | WO 02/067309 A1 | 8/2002 |
| WO | 2009/131133 A1 | 10/2009 |
| WO | 2010/067844 A1 | 6/2010 |
| WO | 2011/071168 A1 | 6/2011 |
| WO | 2011/111421 A1 | 9/2011 |
| WO | 2012/070541 A1 | 5/2012 |
| WO | 2012/070542 A1 | 5/2012 |

OTHER PUBLICATIONS

JP Office Action of Appln. No. 2014-146000 dated Jun. 2, 2015.
Communication dated Jul. 30, 2013, in connection with Japanese Patent Application No. 2012-504347, 2 pages; Japanese Patent Office, Japan.
U.S. Office Action issued in U.S. Appl. No. 13/582,969 dated Apr. 16, 2013.
U.S. Office Action issued in U.S. Appl. No. 13/582,969 dated Feb. 11, 2016.
U.S. Office Action issued in U.S. Appl. No. 13/582,969 dated Apr. 27, 2015.
U.S. Office Action issued in U.S. Appl. No. 13/582,969 dated Apr. 8, 2014.
U.S. Office Action issued in U.S. Appl. No. 13/582,972 dated Dec. 6, 2016.
U.S. Office Action issued in U.S. Appl. No. 13/582,972 dated May 19, 2015.
U.S. Office Action issued in U.S. Appl. No. 13/582,972 dated May 30, 2015.
U.S. Office Action issued in U.S. Appl. No. 13/582,972 dated Nov. 2, 2015.
U.S. Office Action issued in U.S. Appl. No. 13/582,972 dated Dec. 11, 2013.
U.S. Office Action issued in U.S. Appl. No. 14/401,233 dated Mar. 23, 2016.
U.S. Office Action issued in U.S. Appl. No. 14/401,233 dated Jul. 18, 2016.
English language mechanical translation of JP 2010153782 A.
Ansari et al., "Synthesis and optical properties of nanostructured Ce(OH)4", Journal of Semiconductors, vol. 31, No. 3, Mar. 2010.
U.S. Office Action dated May 6, 2014, in connection with U.S. Appl. No. 13/582,961; 34 pages; U.S. Patent and Trademark Office; Alexandria, Virginia; USA.
U.S. Office Action dated May 20, 2014, in connection with U.S. Appl. No. 13/756,456; 29 pages; U.S. Patent and Trademark Office; Alexandria, Virginia; USA.
Communication dated Jun. 20, 2013, in connection with International Application No. PCT/JP2011/076827; 8 pages; the International Bureau of WIPO; Geneva, Switzerland.
Communication dated Jun. 20, 2013, in connection with International Application No. PCT/JP2011/076822; 8 pages; the International Bureau of WIPO; Geneva, Switzerland.
Communication dated Jun. 20, 2013, in connection with International Application No. PCT/JP2011/076830; 7 pages; the International Bureau of WIPO; Geneva, Switzerland.
English translation of PCT/ISA/237 in connection with No. PCT/JP2011/076822, 5 pages.
Certified English translation of claims from PCT/JP2011/076822, 6 pages.
U.S. Office Action issued in U.S. Appl. No. 13/582,969 dated Sep. 17, 2013.
U.S. Office Action dated Mar. 27, 2013 in connection with U.S. Appl. No. 13/582,961; 11 pages; U.S. Patent and Trademark Office; Alexandria, Virginia; USA.
English translation of PCT/ISA/237 in connection with No. PCT/JP2011/076827, 6 pages.
Certified English translation of claims from PCT/JP2011/076827, 5 pages.
Skoog, Douglas A., et al., "Fundamentals of Analytical Chemistry", Seventh Edition, Saunders College Publishing, 1996, pp. 502-519.
U.S. Office Action dated May 30, 2013, in connection with U.S. Appl. No. 13/582,972, 72 pages; U.S. Patent and Trademark Office; Alexandria, Virginia; USA.
Communication issued in connection with PCT Application No. PCT/JP2013/058770, dated Dec. 4, 2014.
Communication issued in PCT Application No. PCT/JP2013/058782, dated Dec. 4, 2014.
International Search Report dated Jul. 2, 2013, in connection with International Application No. PCT/JP2013/058782, 2 pages.
Communication issued in PCT Application No. PCT/JP2013/058831, dated Dec. 4, 2014.

(56) References Cited

OTHER PUBLICATIONS

U.S. Office Action issued in U.S. Appl. No. 13/755,024 dated Dec. 13, 2016.
U.S. Office Action issued in U.S. Appl. No. 13/755,024 dated Jun. 19, 2015.
U.S. Office Action issued in U.S. Appl. No. 13/755,024 dated Jun. 4, 2013.
U.S. Office Action issued in U.S. Appl. No. 13/755,024 dated Feb. 17, 2016.
U.S. Office Action issued in U.S. Appl. No. 13/755,024 dated Dec. 18, 2013.
U.S. Office Action issued in U.S. Appl. No. 14/401,283 dated Nov. 2, 2016.
U.S. Office Action issued in U.S. Appl. No. 14/401,246 dated May 17, 2016.
U.S. Office Action issued in U.S. Appl. No. 14/401,246 dated Aug. 12, 2015.
U.S. Office Action issued in U.S. Appl. No. 14/401,246 dated Feb. 10, 2016.
U.S. Office Action issued in U.S. Appl. No. 13/582,969 dated Nov. 27, 2015.
U.S. Office Action issued in U.S. Appl. No. 13/582,969 dated Sep. 16, 2015.
U.S. Office Action issued in U.S. Appl. No. 13/582,969 dated Oct. 9, 2014.
English translation of International Preliminary Report of Appln. No. PCT/JP2011/050991 dated Oct. 11, 2012.

* cited by examiner

SLURRY, POLISHING FLUID SET, POLISHING FLUID, AND SUBSTRATE POLISHING METHOD USING SAME

TECHNICAL FIELD

The present invention relates to a slurry, a polishing liquid set, a polishing liquid and a substrate polishing method using the same. In particular, the present invention relates to a slurry, a polishing liquid set, a polishing liquid and a substrate polishing method using the same, for semiconductor use.

BACKGROUND ART

Highly precise and sophisticated polishing of substrate surfaces is necessary in many cases including for substrates such as glasses for flat panel display, magnetic disks and silicon wafers for semiconductor, and insulating films, metal layers, barrier layers and the like which are formed in semiconductor device manufacturing steps. Such polishing is usually carried out using a polishing liquid comprising abrasive grains including silica, alumina, zirconia or cerium oxide, for example, according to the purpose of use.

The progressively high integration and micronization in semiconductor device manufacturing steps in recent years is further reducing the permissible sizes of scratches generated on the surface to be polished during polishing. It is therefore becoming more difficult to reduce scratches.

A variety of different abrasive grains are used to reduce scratches. For example, polishing liquids widely used for polishing of inorganic insulating films such as silicon oxide films in semiconductor device manufacturing steps are polishing liquids comprising cerium oxide as abrasive grains (see Patent document 1, for example). Cerium oxide has a lower hardness than silica or alumina, and produces fewer scratches on surfaces to be polished, and it is therefore widely used as abrasive grains.

It is also often attempted to reduce the abrasive grain particle sizes in order to reduce scratches. However, reducing the abrasive grain particle sizes lowers the mechanical effect of the abrasive grains, and thus reduces the polishing rate. Therefore, it is attempted, with abrasive grains used in the prior art, to achieve both increased polishing rate and reduced scratches by controlling the particle sizes of the abrasive grains, but it is still extremely difficult to reduce scratches. This problem is being studied with the aim of achieving both increased polishing rate and reduced scratches by using a polishing liquid comprising tetravalent cerium hydroxide particles (see Patent document 2, for example), and research is also being conducted on methods for producing tetravalent cerium hydroxide particles (see Patent document 3, for example).

In order to achieve flat polishing of inorganic insulating films with irregularities, an excellent polishing selective ratio of the film to be polished, such as a silicon oxide film, with respect to the stopper film, such as a silicon nitride film (polishing rate ratio: polishing rate for film to be polished/polishing rate for stopper film) is required for polishing liquids comprising such tetravalent cerium hydroxide particles. Various additives has been added to polishing liquids and investigated in order to solve this problem. For example, polishing liquids that can improve the flatness of polished surfaces have been proposed, wherein anionic additives are added to the polishing liquids for a satisfactory polishing rate for silicon oxide films with essentially no polishing of silicon nitride films (namely, having polishing selectivity of silicon oxide films to silicon nitride films) (see Patent document 4, for example).

A variety of additives have thus been investigated in order to adjust the properties of polishing liquids, but depending on the additives used, there has sometimes been a trade-off between the effect obtained by the additives and reduction in polishing rate.

CITATION LIST

Patent Literature

[Patent document 1] Japanese Unexamined Patent Application Publication HEI No. 9-270402
[Patent document 2] International Patent Publication No. WO 02/067309
[Patent document 3] Japanese Unexamined Patent Application Publication No. 2006-249129
[Patent document 4] Japanese Unexamined Patent Application Publication No. 2002-241739

SUMMARY OF INVENTION

Technical Problem

Against such problems, conventionally, changing the types of additives or reducing the amounts of additives is generally attempted in order to achieve both polishing rate and the functions obtained by the additives, but there have been limits to the functions obtained by the additives. In recent years it is being required for polishing liquids to achieve even higher levels for both the polishing rate and the addition effects of additives.

The present invention solves the problems described above, and it is an object thereof to provide a slurry that allows polishing of a film to be polished at an excellent polishing rate. It is another object of the invention to provide a slurry that can yield a polishing liquid that allows the addition effects of additives to be obtained while also allowing polishing of a film to be polished at an excellent polishing rate.

It is yet another object of the invention to provide a polishing liquid set and a polishing liquid that allow the addition effects of additives to be obtained while also allowing polishing of a film to be polished at an excellent polishing rate.

It is yet another object of the invention to provide a polishing method using the polishing liquid set or the polishing liquid.

Solution to Problem

The present inventors have conducted diligent research toward increasing the speed of polishing using polishing liquids for semiconductor, and as a result they have found that, in a slurry comprising tetravalent cerium hydroxide particles as the abrasive grains, it is possible to inhibit reduction in polishing rate when additives have been added, by using abrasive grains that can increase the light transmittance to light of a specific wavelength in an aqueous dispersion comprising the abrasive grains in a specific amount, and have completed this invention.

More specifically, the slurry of the invention comprises abrasive grains and water, the abrasive grains including tetravalent cerium hydroxide particles and producing light transmittance of at least 50%/cm for light with a wavelength of 500 nm in an aqueous dispersion with the content of the abrasive grains adjusted to 1.0 mass %.

According to such a slurry, it is possible to inhibit reduction in the polishing rate for films to be polished (such as inorganic insulating films) when additives have been added to the slurry, thus allowing both an excellent polishing rate and addition effects of additives than with a conventional polishing liquid. In addition, it is also possible to accomplish polishing of films to be polished with excellent polishing rate when the slurry is used for polishing without addition of additives.

The mean particle size of the abrasive grains is preferably 1-150 nm. This will allow an even more excellent polishing rate to be obtained for films to be polished.

The pH of the slurry is preferably 2.0-9.0. This will allow an even more excellent polishing rate to be obtained for films to be polished.

The content of the abrasive grains is preferably 0.01-15 mass % based on the total mass of the slurry. This will allow an even more excellent polishing rate to be obtained for films to be polished.

The content of the tetravalent cerium hydroxide particles is preferably 0.01-10 mass % based on the total mass of the slurry. This will allow an even more excellent polishing rate to be obtained for films to be polished. From the same viewpoint, the abrasive grains are preferably composed of tetravalent cerium hydroxide particles.

The polishing liquid set of the invention comprises constituent components of a polishing liquid separately stored as a first liquid and second liquid, so that the first liquid and second liquid are mixed to form the polishing liquid, wherein the first liquid is the aforementioned slurry, and the second liquid comprises an additive and water. This will allow a polishing liquid with even more excellent storage stability to be obtained.

In the polishing liquid set of the invention, the mean particle size of the abrasive grains in the polishing liquid is preferably 1-200 nm.

In the polishing liquid set of the invention, the ratio of change of the mean particle size of the abrasive grains is preferably not greater than 30%, before and after mixing the first liquid and second liquid. Specifically, the mean particle size R1 of the abrasive grains in the first liquid and the mean particle size R2 of the abrasive grains in the polishing liquid preferably satisfy the following formula (1). This will allow a polishing liquid set to be prepared which has low change in the particle size of the abrasive grains before and after mixing the first liquid and second liquid, therefore even more excellent polishing rate can be obtained for films to be polished.

$$|R1-R2|/R1 \times 100 \leq 30 \quad (1)$$

The additive is preferably at least one type selected from among dispersing agents, polishing rate improvers, flattening agents and selective ratio improvers. This will allow reduction in polishing rate to be prevented while obtaining the effects of each of the additives.

The additives preferably is a vinyl alcohol polymer and/or a vinyl alcohol polymer derivative. A vinyl alcohol polymer and a vinyl alcohol polymer derivative exhibit effects of improving the stability of the polishing liquid, by use in combination with tetravalent cerium hydroxide particles.

The content of the additive in the polishing liquid is preferably 0.01 mass % or greater based on the total mass of the polishing liquid.

The polishing liquid of the invention may be prepared as the one-pack polishing liquid obtained by pre-mixing the first liquid and second liquid into a single liquid. Specifically, the polishing liquid of the invention comprises abrasive grains, an additive and water, the abrasive grains including tetravalent cerium hydroxide particles and producing light transmittance of at least 50%/cm for light with a wavelength of 500 nm in an aqueous dispersion with the content of the abrasive grains adjusted to 1.0 mass %.

In the polishing liquid of the invention, it is possible to obtain the addition effects of additives while also accomplishing polishing of a film to be polished at an excellent polishing rate.

The content of tetravalent cerium hydroxide particles in the one-pack polishing liquid is preferably 0.01-8 mass % based on the total mass of the polishing liquid. This will allow an even more excellent polishing rate to be obtained for films to be polished.

The mean particle size of the abrasive grains in the one-pack polishing liquid is preferably 1-200 nm.

The pH of the one-pack polishing liquid is preferably 3.0-9.0. This will allow an even more excellent polishing rate to be obtained for films to be polished.

The additive in the one-pack polishing liquid is preferably at least one type selected from among dispersing agents, polishing rate improvers, flattening agents and selective ratio improvers. This will allow reduction in polishing rate to be prevented while obtaining the effects of each of the additives.

The additive in the one-pack polishing liquid is preferably a vinyl alcohol polymer and/or a vinyl alcohol polymer derivative. A Vinyl alcohol polymer and a vinyl alcohol polymer derivative exhibit effects of improving the stability of polishing liquid, by use in combination with tetravalent cerium hydroxide particles.

The content of the additive in the one-pack polishing liquid is preferably 0.01 mass % or greater based on the total mass of the polishing liquid.

The substrate polishing method of the invention comprises a step of placing a film to be polished, of a substrate which has the film to be polished on its surface, so as to face an abrasive pad, and a step of polishing at least a portion of the film to be polished while supplying the one-pack polishing liquid between the abrasive pad and the film to be polished.

The substrate polishing method of the invention also comprises a step of placing a film to be polished, of a substrate which has the film to be polished on its surface, so as to face an abrasive pad, a step of mixing the first liquid and second liquid of the polishing liquid set to obtain the polishing liquid, and a step of polishing at least a portion of the film to be polished while supplying the polishing liquid between the abrasive pad and the film to be polished.

The substrate polishing method of the invention also comprises a step of placing a film to be polished, of a substrate which has the film to be polished on its surface, so as to face an abrasive pad, and a step of polishing at least a portion of the film to be polished while supplying the first liquid and second liquid of the polishing liquid set between the abrasive pad and the film to be polished.

According to these substrate polishing methods, it is possible to obtain the addition effects of additives while also accomplishing polishing of a film to be polished at an excellent polishing rate. It is also possible to accomplish polishing of a film to be polished at higher rate and to greater flatness than with a conventional polishing liquid.

Advantageous Effects of Invention

According to the slurry of the invention it is possible to accomplish polishing of a film to be polished at an excellent polishing rate than with a conventional polishing liquid. In addition, according to the slurry of the invention, it is possible to obtain a polishing liquid that allows the addition effects of additives to be obtained while also allowing polishing of a film to be polished at an excellent polishing rate than with a conventional polishing liquid. According to the polishing liquid set and polishing liquid of the invention, it is possible to inhibit reduction in polishing rate for a film to be polished even when the polishing liquid contains additives, and it is therefore possible to obtain the effects of the additives while also allowing polishing of the film to be polished at an excellent polishing rate than with a conventional polishing liquid.

Furthermore, according to the invention, it is easier to obtain different properties required depending on object to be polished, while maintaining the property of high-rate polishing of semiconductor surfaces in wiring formation steps. In addition, according to the invention, it is possible to accomplish high-rate polishing of a diverse range of substrates by controlling the types of additives.

DESCRIPTION OF EMBODIMENTS

Figure 1:
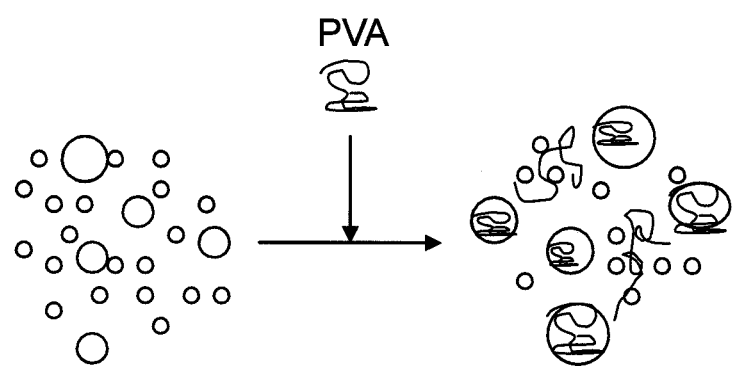
FIG. 1 is a schematic diagram showing the aggregated condition of abrasive grains when an additive has been added.

An embodiment of the invention will now be explained in detail. The polishing liquid of this embodiment can be obtained by mixing a slurry (first liquid) comprising at least water and abrasive grains with an additive liquid (second liquid) comprising at least an additive and water. In this embodiment, the polishing liquid and the slurry differ in the presence or absence of the additive.
(Slurry)

The slurry of this embodiment comprises at least water and abrasive grains dispersed in the water, wherein the abrasive grains include tetravalent cerium hydroxide particles and produce light transmittance of at least 50%/cm for light with a wavelength of 500 nm in an aqueous dispersion with the content of the abrasive grains adjusted to 1.0 mass %. The constituent components of the slurry of this embodiment will now be explained in detail.

The slurry of this embodiment includes tetravalent cerium hydroxide particles as the abrasive grains. The tetravalent cerium hydroxide particles may be obtained, for example, by mixing a tetravalent cerium salt and an alkali solution. This technique is explained in detail in Japanese Unexamined Patent Application Publication No. 2006-249129, for example.

Any known tetravalent cerium salt may be used without any particular restrictions, with specific examples including $Ce(SO_4)_2$, $Ce(NH_4)_2(NO_3)_6$ and $Ce(NH_4)_4(SO_4)_4$.

Known alkali solutions may be used, without any particular restrictions. Specific examples of bases to be used as alkaline sources in the alkali solution include organic bases such as ammonia, triethylamine, pyridine, piperidine, pyrrolidine, imidazole and chitosan; and inorganic bases such as potassium hydroxide and sodium hydroxide, among which ammonia is preferred in that it is widely used in industry and is readily and cheaply available.

The method described above yields a suspension of cerium hydroxide particles. When the obtained suspension contains metal impurities, for example, the metal impurities may be removed by a method such as repeated solid-liquid separation by centrifugal separation or the like. A slurry may be obtained by adding water (purified water) as a medium after adequate washing of the suspension containing the cerium hydroxide particles, and/or separation of the cerium hydroxide particles, but the washed suspension may also be used directly as a slurry without separation of the cerium hydroxide particles.

The method of dispersing the cerium hydroxide particles in the obtained slurry may be ordinary stirring dispersion, or a homogenizer, ultrasonic disperser, wet ball mill or the like may be used.

With the abrasive grains used in the slurry of this embodiment, the light transmittance for light with a wavelength of 500 nm is at least 50%/cm in the aqueous dispersion with a content (concentration) of the abrasive grains adjusted to 1.0 mass %. This will inhibit reduction in the polishing rate even when the additives mentioned below are added to the slurry, and will make it easier to obtain other properties while maintaining the polishing rate. From the same viewpoint, the light transmittance is preferably at least 60%/cm, more preferably at least 70%/cm, even more preferably at least 80%/cm and especially preferably at least 90%/cm. The upper limit for the light transmittance is 100%/cm.

Although the reason for which reduction in polishing rate can be inhibited by adjusting the light transmittance of the abrasive grains is not thoroughly understood, the present inventors conjecture as follows. It is conjectured that the dominant action of tetravalent cerium hydroxide particles as abrasive grains is chemical function rather than mechanical function. Therefore, it is conjectured that the number of abrasive grains contributes to the polishing rate more than the sizes of the abrasive grains.

In this regard, in the case of low light transmittance in an aqueous dispersion having an abrasive grain content of 1.0 mass %, the abrasive grains present in the aqueous dispersion presumably include more particles with relatively large particle sizes (hereunder referred to as "coarse particles"). When an additive (such as PVA) is added to a slurry comprising such abrasive grains, other particles aggregate around the coarse particles as nuclei, as shown in FIG. 1. As a result, it is conjectured that, the number of abrasive grains acting on the surface to be polished per unit area (the effective abrasive grain number) is reduced and therefore the specific surface area of the abrasive grains contacting with the surface to be polished is reduced, whereby the polishing rate is lowered.

Figure 2:
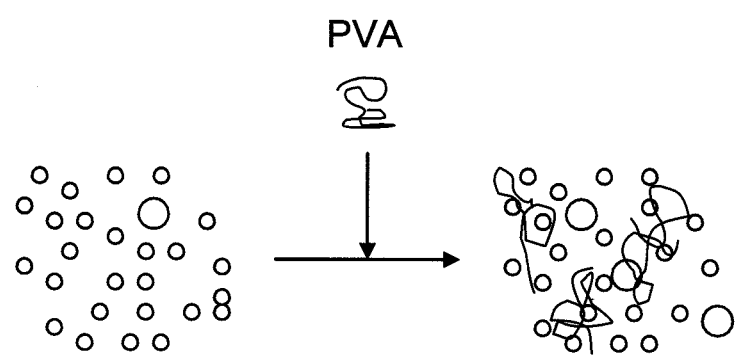
FIG. 2 is a schematic diagram showing the aggregated condition of abrasive grains when an additive has been added.

Conversely, in the case of high light transmittance in an aqueous dispersion having an abrasive grain content of 1.0 mass %, the abrasive grains present in the aqueous dispersion presumably include fewer "coarse particles". In such cases with a low abundance of coarse particles, as shown in FIG. 2, few coarse particles available as nuclei for aggregation are present, even when an additive (such as PVA) is added to the slurry, and therefore aggregation between abrasive grains is inhibited or the sizes of the aggregated particles are smaller than the aggregated particles shown in FIG. 1. As a result, it is conjectured that, the number of abrasive grains acting on the surface to be polished per unit area (the effective abrasive grain number) is maintained and therefore the specific surface area of the abrasive grains contacting with the surface to be polished is maintained, whereby the polishing rate is not easily lowered.

According to research by the present inventors, it was found that even among polishing liquids having identical particle sizes as measured with a common particle size measuring apparatus, some may be visually transparent (high light transmittance) and some visually turbid (low light transmittance). This suggests that coarse particles, which produce the effect described above, can contribute to reduced polishing rate even in slight amounts that cannot be detected with common particle size measuring apparatuses.

It was also found that even repeated filtration to reduce the amount of coarse particles does not significantly improve the phenomenon of lower polishing rate with addition of additives, and in some cases the effect of improved polishing rate due to light transmittance is not adequately exhibited. Then, the present inventors found that this problem can be overcome by using abrasive grains with high light transmittance in aqueous dispersion, by modifying the method for producing the abrasive grains or the like.

The light transmittance is the transmittance for light with a wavelength of 500 nm. The light transmittance is measured with a spectrophotometer, and specifically, it may be measured with an U3310 Spectrophotometer (apparatus name) by Hitachi, Ltd., for example.

As a more specific measuring method, measurement is conducted by preparing a measuring sample (aqueous dispersion) with water dilution or concentration to an abrasive grain content of 1.0 mass %, placing approximately 4 mL (where L represents liters, same hereunder) in a 1 cm-square cell, and setting the cell in the apparatus. When the measuring sample is an aqueous dispersion having a light transmittance of at least 50%/cm in a state with the abrasive grains present at greater than 1.0 mass %, the light transmittance will be at least 50%/cm even when the measuring sample is diluted to 1.0 mass %. Therefore, measuring the light transmittance in a state with the abrasive grains present at greater than 1.0 mass % allows screening of the light transmittance with a convenient method.

The method of controlling the light transmittance will now be explained. The method of altering the light transmittance may be one in which, for example, mild reaction between a metal salt and an alkali solution takes place during production of the abrasive grains, for increased light transmittance. This can inhibit rapid grain growth and can reduce the proportion of coarse particles in the abrasive grains.

The method of altering the light transmittance may involve, for example, controls of the starting concentrations for the metal salt aqueous solution and the alkali solution, the mixing rate of the metal salt aqueous solution and the alkali solution, the stirring speed for mixing, or the liquid temperature during mixing. Control of these will now be described in detail.

[Starting Concentrations]

By controlling the starting concentrations of the metal salt aqueous solution and the alkali solution, it is possible to alter the light transmittance. Specifically, the light transmittance tends to be higher when the starting concentrations are reduced, while the light transmittance tends to be lower when the starting concentrations are increased. When a nitrogen-containing heterocyclic organic base or the like exhibiting weak basicity is used as the base, the starting concentration of the alkali solution is preferably higher than when ammonia is used.

The upper limit of the concentration for the metal salt is preferably not greater than 1.0 mol/L, more preferably not greater than 0.5 mol/L, even more preferably not greater than 0.1 mol/L and especially preferably not greater than 0.05 mol/L, from the viewpoint of inhibiting rapid occurrence of the reaction. The lower limit of the content for the metal salt is not particularly restricted from the standpoint of light transmittance, but it is preferably 0.01 mol/L or greater in order to minimize the amount of aqueous solution used to obtain the prescribed amount of tetravalent cerium hydroxide particles.

The upper limit of the starting concentration for the alkali solution is preferably not greater than 25 mol/L, more preferably not greater than 20 mol/L and even more preferably not greater than 15 mol/L, from the viewpoint of inhibiting rapid occurrence of the reaction. The lower limit of the starting concentration for the alkali solution is not particularly restricted from the standpoint of light transmittance, but it is preferably 0.1 mol/L or greater in order to minimize the amount of aqueous solution used to obtain the prescribed amount of tetravalent cerium hydroxide particles.

[Mixing Rate]

By controlling the mixing rate of the metal salt aqueous solution and the alkali solution, it is possible to alter the light transmittance. Specifically, the light transmittance tends to be higher when the mixing rate is increased, while the light transmittance tends to be lower when the mixing rate is decreased. The mixing rate is preferably 0.1 cc/min or greater and preferably not greater than 50 cc/min. However, the mixing rate is preferably determined by the starting concentrations, and specifically, the mixing rate is preferably decreased when the starting concentrations are high, for example.

[Stirring Speed]

By controlling the stirring speed for mixing of the metal salt aqueous solution and the alkali solution, it is possible to alter the light transmittance. Specifically, the light transmittance tends to be higher when the stirring speed is increased, while the light transmittance tends to be lower when the stirring speed is decreased.

As the stirring speed, for example, in the case of a mixing scale in which a stirring blade with a total length of 4 cm is used for stirring of a 2 L solution, the rotational speed of the stirring blade (the stirring speed) is preferably 50-1000 rpm. The upper limit for the rotational speed is preferably not greater than 1000 rpm, more preferably not greater than 800 rpm and even more preferably not greater than 500 rpm, from the viewpoint of preventing excessive increase in the liquid level. Modifying (for example, enlarging) the mixing scale allows change to the optimal stirring speed, but so long as it is within the range of about 50-1000 rpm, it is possible to obtain a slurry with satisfactory light transmittance.

[Liquid Temperature]

By controlling the liquid temperature for mixing of the metal salt aqueous solution and the alkali solution, it is possible to alter the light transmittance. Specifically, the light transmittance tends to be higher when the liquid temperature is reduced, while the light transmittance tends to be lower when the liquid temperature is increased.

The liquid temperature is preferably within the range of 0-60° C., as the temperature in the reaction system read upon placing a thermometer in the reaction system. The upper limit for the liquid temperature is preferably not higher than 60° C., more preferably not higher than 50° C., even more preferably not higher than 40° C., especially preferably not higher than 30° C. and extremely preferably not higher than 25° C., from the viewpoint of preventing rapid reaction. The lower limit for the liquid temperature is preferably 0° C. or higher, more preferably 5° C. or higher, even more preferably 10° C. or higher, especially preferably 15° C. or higher and extremely preferably 20° C. or higher, from the viewpoint of facilitating progress of the reaction, since a very low liquid temperature will interfere with progress of the reaction.

The mean particle size R1 of the abrasive grains in the slurry is preferably in the range of 1-150 nm. The upper limit for the mean particle size R1 is preferably not greater than 150 nm, more preferably not greater than 120 nm, even more preferably not greater than 100 nm and especially preferably not greater than 80 nm, from the viewpoint of reducing the mean particle size in order to increase the specific surface area of the abrasive grains contacting the surface to be polished, thereby allowing the polishing rate to be further improved. The lower limit for the mean particle size R1 is preferably 1 nm or greater, more preferably 2 nm or greater and even more preferably 5 nm or greater, since a certain degree of large mean particle size will tend to facilitate increase in the polishing rate.

In this embodiment, the mean particle size R1 is the secondary particle diameter that can be measured by a photon correlation method, and specifically, it can be measured using a Zetasizer 3000HS (apparatus name) by Malvern Instruments Ltd. or a N5 (apparatus name) by Coulter. The following is an example of a specific measuring method using a Zetasizer 3000HS. The slurry is diluted with water or concentrated to an abrasive grain content of 0.2 mass %, to prepare a measuring sample. Approximately 4 mL of the measuring sample is placed in a 1 cm-square cell, and the cell is set in the apparatus. Measurement is conducted at 25° C. with a dispersing medium refractive index of 1.33 and a viscosity of 0.887 mPa·s, and the value represented by the Z-average size is read as the mean particle size.

The content of the abrasive grains is not particularly restricted, but it is preferably not greater than 15 mass % based on the total mass of the slurry, from the viewpoint of helping to avoid aggregation of the abrasive grains. The content of the abrasive grains is preferably 0.01 mass % or greater based on the total mass of the slurry, from the viewpoint of facilitating the mechanical effect of the abrasive grains.

It is believed that, among the constituent components in the slurry of this embodiment, the tetravalent cerium hydroxide particles contribute most to polishing of inorganic insulating films and the like. The content of the tetravalent cerium hydroxide particles is preferably not greater than 10 mass % based on the total mass of the slurry, from the viewpoint of helping to avoid aggregation of the abrasive grains. The content of the tetravalent cerium hydroxide particles is preferably 0.01 mass % or greater based on the total mass of the slurry, from the viewpoint of allowing the function of the tetravalent cerium hydroxide particles to be adequately exhibited.

The slurry of this embodiment may employ cerium hydroxide particles in combination with other types of abrasive grains, within a range that does not impair the properties of the tetravalent cerium hydroxide particles, and specifically, abrasive grains composed of such as silica, alumina or zirconia, for example, may be used. However, from the viewpoint of obtaining an even more excellent polishing rate, the abrasive grains are preferably composed of tetravalent cerium hydroxide particles, with the preferred content described above.

There are no particular restrictions on the water used in the slurry of this embodiment and in the additive liquid described hereunder, but deionized water or ultrapure water is preferred. The water content is not particularly restricted and may be the content of the remainder excluding the other constituent components.

The pH of the slurry is preferably in the range of 2.0-9.0, from the viewpoint of obtaining an even more excellent polishing rate. From the viewpoint of stabilizing the pH of the slurry and minimizing problems such as aggregation of abrasive grains due to addition of a pH stabilizer, the lower limit for the pH is preferably 2.0 or greater, more preferably 3.0 or greater and even more preferably 3.5 or greater. Also, from the viewpoint of excellent dispersibility of the abrasive grains and obtaining an even more excellent polishing rate, the upper limit for the pH is preferably not greater than 9.0, more preferably not greater than 8.0, even more preferably not greater than 7.0 and especially preferably not greater than 6.0.

When the slurry is used directly for polishing, the pH of the slurry is preferably 3.0-9.0. From the viewpoint of stabilizing the pH of the polishing liquid and minimizing problems such as aggregation of abrasive grains due to addition of a pH stabilizer, the lower limit for the pH is preferably 3.0 or greater, more preferably 4.0 or greater and even more preferably 5.0 or greater. Also, from the viewpoint of excellent dispersibility of the abrasive grains and obtaining an even more excellent polishing rate, the upper limit for the pH is preferably not greater than 9.0, more preferably not greater than 8.0 and even more preferably not greater than 7.5, while from the viewpoint of excellent stable dispersibility even with a high abrasive grain concentration, it is especially preferably not greater than 7.0 and extremely preferably not greater than 6.5.

The pH of the slurry can be measured with a pH meter (for example, a Model PH81 by Yokogawa Electric Corp.). The pH that is used may be obtained by placing an electrode in the slurry after 2-point calibration using standard buffer (phthalate pH buffer: pH 4.01 (25° C.), neutral phosphate pH buffer: pH 6.86 (25° C.)), and by measuring the value upon stabilization after an elapse of 2 minutes or more.

Any known pH regulator may be used to adjust the pH of the slurry, without any particular restrictions, and specifically, there may be used inorganic acids such as phosphoric acid, sulfuric acid or nitric acid; organic acids such as formic acid, acetic acid, propionic acid, maleic acid, phthalic acid, citric acid or succinic acid; amines such as ethylenediamine, toluidine, piperazine, histidine or aniline; and nitrogen-containing heterocyclic compounds such as pyridine, imidazole, triazole or pyrazole.

A pH stabilizer is an additive for adjustment to a prescribed pH, and it is preferably a buffer component. The buffer component is preferably a compound with a pKa in the range of ±1.5, and more preferably a compound with a pKa in the range of ±1.0, relative to the prescribed pH. Such compounds include amino acids such as glycine, arginine, lysine, asparagine, aspartic acid and glutamic acid.

(Polishing Liquid Set)

The polishing liquid of this embodiment may be prepared as a polishing liquid set in which the constituent components of the polishing liquid are separated into and stored as two liquids, the slurry described above and an additive liquid comprising additives dissolved in water, so that the polishing liquid is produced by mixing the slurry and additive liquid. The polishing liquid set is used as a polishing liquid by mixing the slurry and additive liquid at the time of polishing, as described hereunder. By thus separating and storing the constituent component of the polishing liquid into at least two liquids, the storage stability of the polishing liquid is improved.

The mean particle size R2 of the abrasive grains in a polishing liquid obtained by mixing a slurry and additive liquid is preferably 1-200 nm. The mean particle size R2 of at least 1 nm will allow a sufficient mechanical effect of the abrasive grains to be obtained. From the same viewpoint, the lower limit for the mean particle size R2 is more preferably 5 nm or greater, even more preferably 10 nm or greater and especially preferably 15 nm or greater. The upper limit for the mean particle size R2 of the abrasive grains is preferably not greater than 200 nm, more preferably not greater than 150 nm and even more preferably not greater than 100 nm, from the viewpoint of increasing the specific surface area of the abrasive grains contacting the surface to be polished, thereby allowing the polishing rate to be further improved.

In the polishing liquid of this embodiment, the mean particle size R2 is the secondary particle diameter that can be measured by a photon correlation method, and for example, it can be measured specifically with a Zetasizer 3000HS (apparatus name) by Malvern Instruments Ltd. or an N5 (apparatus name) by Coulter. The following is a specific measuring method using a Zetasizer 3000HS. After obtaining the polishing liquid by mixing the slurry and additive liquid, the polishing liquid is diluted with water or concentrated to an abrasive grain content of 0.2 mass %, to prepare a measuring sample. Next, approximately 4 mL of the measuring sample is placed in a 1 cm-square cell, and the cell is set in the apparatus. Then, measurement is conducted at 25° C. with a dispersing medium refractive index of 1.33 and a viscosity of 0.887 mPa·s, and the value represented by the Z-average size is read as the mean particle size.

When the mean particle size of the abrasive grains is compared before and after mixture of the slurry and additive liquid, the polishing liquid set of this embodiment preferably has a small rate of change thereof. Specifically, the rate of change is preferably not greater than 30%, more preferably not greater than 20% and even more preferably not greater than 10%. A rate of change of not greater than 30% for the mean particle size of the abrasive grains means that the mean particle size R1 and the mean particle size R2 satisfy the following formula (2). The value |R1−R2| represents the absolute value of the difference between R1 and R2.

$$|R1-R2|/R1 \times 100 \leq 30 \qquad (2)$$

A polishing liquid comprising abrasive grains dispersed in water generally tends to have more aggregation of abrasive grains upon addition of an additive. In this embodiment, however, aggregation of abrasive grains can be further inhibited by using abrasive grains that produce light transmittance of at least 50%/cm for light with a wavelength of 500 nm in an aqueous dispersion with the content of the abrasive grains adjusted to 1.0 mass %, while lowering the rate of change of the mean particle size. This embodiment can therefore achieve even higher levels for the addition effect of additives and the effect of improved polishing rate.

The content of the abrasive grains is preferably 0.01-10 mass % and more preferably 0.1-5 mass %, based on the total mass of the polishing liquid. The content of the tetravalent cerium hydroxide particles is preferably 0.01-8 mass % and more preferably 0.1-5 mass %, based on the total mass of the polishing liquid.

The pH of the polishing liquid obtained by mixing the slurry and additive liquid is preferably in the range of 3.0-9.0, from the viewpoint of obtaining an even more excellent polishing rate. From the viewpoint of stabilizing the pH of the polishing liquid and minimizing problems such as aggregation of abrasive grains due to addition of a pH stabilizer, the lower limit for the pH is preferably 3.0 or greater, more preferably 4.0 or greater and even more preferably 5.0 or greater. Also, from the viewpoint of excellent dispersibility of the abrasive grains and obtaining an even more excellent polishing rate, the upper limit for the pH is preferably not greater than 9.0, more preferably not greater than 8.0 and even more preferably not greater than 7.5, from the viewpoint of excellent stable dispersibility even with a high abrasive grain concentration, it is especially preferably not greater than 7.0 and yet more preferably not greater than 6.5.

The pH of the polishing liquid can be measured in the same manner as the pH of the slurry. Also, the same pH regulator and pH stabilizer, used for adjustment of the pH of the slurry, may be used for adjustment of the pH of the polishing liquid.

(Additive Liquid)

The polishing liquid obtained using the slurry of this embodiment allows an especially excellent polishing rate to be obtained for inorganic insulating films (for example, silicon oxide films), and is therefore especially suitable for polishing of substrates with inorganic insulating films. Such a polishing liquid can be obtained by adding an additive liquid, containing additives that impart other functions, to the slurry.

An additive used in the additive liquid may be a known additive without any particular restrictions, such as a dispersing agent that increases the dispersibility of the abrasive grains, a polishing rate improver that increases the polishing rate, a flattening agent (a flattening agent that reduces irregularities on the polished surface after polishing, or a global flattening agent that improves the in-plane uniformity of the substrate after polishing), or a selective ratio improver that improves the polishing selective ratio with respect to stopper films such as silicon nitride films or polysilicon films.

Examples of dispersing agents include vinyl alcohol polymers and their derivatives, betaine, lauryl betaine, lauryldimethylamine oxide, and the like. Examples of polishing rate improvers include β-alanine betaine, stearyl betaine, and the like. Examples of flattening agents that reduce irregularities on polished surfaces include ammonium lauryl sulfate, triethanolamine polyoxyethylene alkyl ether sulfate, and the like. Examples of global flattening agents include polyvinylpyrrolidone, polyacrolein, and the like. Examples of selective ratio improvers include polyethyleneimine, polyallylamine, chitosan, and the like. These may be used alone or in combinations of two or more.

The polishing liquid of this embodiment preferably comprises a vinyl alcohol polymer or a derivative thereof as an additive. However, vinyl alcohol, which is the monomer of polyvinyl alcohol, generally tend not to exist alone as a stable compound. Therefore, polyvinyl alcohol is usually obtained by polymerization of a vinyl carboxylate monomer such as vinyl acetate monomer to obtain poly(vinyl carboxylate), followed by saponification (hydrolysis). Thus, a vinyl alcohol polymer obtained using vinyl acetate monomer as the starting material has —OCOCH$_3$ and hydrolyzed —OH groups as functional groups in the molecule, and the proportion of —OH groups is defined as the saponification degree. That is, a vinyl alcohol polymer whose saponification degree is not 100% has a structure which is essentially a copolymer of vinyl acetate and vinyl alcohol. The vinyl alcohol polymer may be one in which a vinyl carboxylate monomer such as vinyl acetate monomer and other vinyl group-containing monomer (for example, ethylene, propylene, styrene or vinyl chloride) are copolymerized, and all or some of the portions derived from the vinyl carboxylate monomer are saponified. The definition of the term "vinyl alcohol polymer" in this invention encompasses all of these polymers, and it also may be considered to be a polymer having the following structural formula.

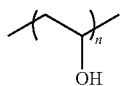
[Chemical Formula 1]

(wherein n represents a positive integer)

The definition of the term "derivative" of a vinyl alcohol polymer includes a derivative of a homopolymer of vinyl alcohol (that is, a polymer with a saponification degree of 100%), and a derivative of a copolymer of a vinyl alcohol monomer and other vinyl group-containing monomer.

Examples of the aforementioned derivatives include polymers having a portion of the hydroxyl groups substituted with amino, carboxyl or ester groups for example, and polymers having a portion of the hydroxyl groups modified. Examples of such derivatives include reactive polyvinyl alcohols (for example, GOHSEFIMER (registered trademark) Z by Nippon Synthetic Chemical Industry Co., Ltd.), cationized polyvinyl alcohols (for example, GOHSEFIMER (registered trademark) K by Nippon Synthetic Chemical Industry Co., Ltd.), anionized polyvinyl alcohols (for example, GOHSERAN (registered trademark) L and GOHSENOL (registered trademark) T by Nippon Synthetic Chemical Industry Co., Ltd.), and hydrophilic group-modified polyvinyl alcohols (for example, ECOMATI by Nippon Synthetic Chemical Industry Co., Ltd.).

As mentioned above, vinyl alcohol polymers and their derivatives function as dispersing agents for abrasive grains, and have effects of improving polishing liquid stability. It is believed that interaction between the hydroxyl groups of the vinyl alcohol polymer or its derivative and tetravalent metal hydroxide particles can inhibit aggregation and minimize changes of particle size in the polishing liquid, thereby improving stability. Also, the vinyl alcohol polymer and its derivative function as a selective ratio improver for the abrasive grains, and when used in combination with tetravalent cerium hydroxide particles, it can increase the polishing selective ratio for inorganic insulating films (for example, silicon oxide films) with respect to stopper films (for example, polysilicon films) (polishing rate for inorganic insulating films/polishing rate for stopper films). In addition, a vinyl alcohol polymer and its derivative may also function as a flattening agent or as an anti-adhesion agent for the abrasive grains on the polished surface (cleanability improver).

The saponification degree of the vinyl alcohol polymer or its derivative is preferably not greater than 95 mol % from the viewpoint of further increasing the polishing selective ratio for inorganic insulating films with respect to stopper films. From the same viewpoint, the saponification degree is more preferably not greater than 90 mol %, even more preferably not greater than 88 mol %, especially preferably not greater than 85 mol %, extremely preferably not greater than 83 mol % and very preferably not greater than 80 mol %.

There are no particular restrictions on the lower limit for the saponification degree, but from the viewpoint of excellent solubility in water, it is preferably 50 mol % or greater, more preferably 60 mol % or greater and even more preferably 70 mol % or greater. The saponification degree of the vinyl alcohol polymer and its derivative can be measured according to JIS K 6726 (Polyvinyl alcohol test method).

The upper limit for the mean polymerization degree (weight-average molecular weight) of the vinyl alcohol polymer and its derivative is not particularly restricted, but from the viewpoint of inhibiting reduction in polishing rate for inorganic insulating films (for example, silicon oxide films), it is preferably not greater than 50000, more preferably not greater than 30000 and even more preferably not greater than 10000.

From the viewpoint of further increasing the polishing selective ratio for inorganic insulating films with respect to stopper films, the lower limit for the mean polymerization degree is preferably 50 or greater, more preferably 100 or greater and even more preferably 150 or greater. The mean polymerization degree of the vinyl alcohol polymer and its derivative can be measured according to JIS K 6726 (Polyvinyl Alcohol Test Method).

In order to adjust the polishing selective ratio for inorganic insulating films with respect to stopper films, and the flatness of polished substrates, a plurality of polymers with different saponification degrees or mean polymerization degrees may be used in combination. In the case of different saponification degrees, the saponification degree of at least one vinyl alcohol polymer or its derivative is preferably not greater than 95 mol %, and for the viewpoint of improving the polishing selective ratio, the average saponification degree calculated from each saponification degree and the mixing ratio is preferably not greater than 95 mol %. The preferred values for these saponification degrees are as specified above.

From the viewpoint of inhibiting excessive reduction in the polishing rate and improving the polishing selective ratio for inorganic insulating films with respect to stopper films, the content of the additive is preferably 0.01 mass % or greater, more preferably 0.1 mass % or greater, even more preferably 0.3 mass % or greater and especially preferably 0.5 mass % or greater based on the total mass of the polishing liquid, when the slurry and additive liquid are mixed to produce the polishing liquid. From the viewpoint of further inhibiting reduction in the polishing rate for inorganic insulating films, the content of the additive is preferably not greater than 10 mass %, more preferably not greater than 5 mass % and even more preferably not greater than 3 mass % based on the total mass of the polishing liquid. When at least one type of vinyl alcohol polymer or its derivative is used as an additive, the total content of the vinyl alcohol polymer and its derivative is preferably in the range specified above.

The content of the additive in the additive liquid is preferably 0.02-20 mass % based on the total mass of the additive liquid, as this will allow the content of the additive in the polishing liquid to be easily adjusted to within the range specified above.

(One-Pack Polishing Liquid)

The polishing liquid of this embodiment may be stored as a one-pack polishing liquid in a state that the slurry and additive of the polishing liquid set are pre-mixed. Storage as a one-pack polishing liquid can eliminate the labor of mixing the slurry and additive liquid before polishing. In addition, storage as a one-pack polishing liquid with pre-adjustment of the water content for polishing can eliminate the labor of adjusting the concentration. The pH of the one-pack polishing liquid and the mean particle size R2 of the abrasive grains preferably satisfy the numerical ranges specified for the polishing liquid to be obtained from a polishing liquid set.

For storage as a one-pack polishing liquid as well, the rate of change of the mean particle size of the abrasive grains is preferably not greater than 30%, more preferably not greater than 20% and even more preferably not greater than 10%, as explained for the polishing liquid set.

In the case of a one-pack polishing liquid, the mean particle size R1 of the abrasive grains in the slurry can be determined in the following manner. Specifically, the one-pack polishing liquid is subjected to a method such as repeated solid-liquid separation by centrifugal separation or the like, for through washing and isolation of the abrasive grains. Next, the isolated abrasive grains are added to water and subjected to ultrasonic dispersion for 2 minutes or longer in order to obtain a slurry. The obtained slurry may be measured by the method described above to determine the mean particle size R1.

(Substrate Polishing Method)

The substrate polishing method using a polishing liquid set or one-pack polishing liquid of this embodiment will now be described.

In the substrate polishing method of this embodiment, polishing is performed on a substrate having an inorganic insulating film (for example, a silicon oxide film) as a film to be polished on its surface. The substrate polishing method of this embodiment comprises at least a substrate positioning step and a polishing step. In the substrate positioning step, a film to be polished, of a substrate which has the film to be polished on its surface, is placed so as to face an abrasive pad. The silicon oxide film, as the inorganic insulating film, may be obtained by low-pressure CVD method, plasma CVD, or the like.

In the polishing step, when using a one-pack polishing liquid, at least a portion of the inorganic insulating film is polished, in a state that the inorganic insulating film of the substrate is pressed against the abrasive pad of the polishing platen, by relatively moving the substrate and the polishing platen while supplying the polishing liquid between the abrasive pad and the inorganic insulating film. Here, the polishing liquid may be supplied directly as a polishing liquid with the prescribed water content, or it may be supplied as a concentrate with a low water content and diluted on the abrasive pad.

When a polishing liquid set is used, there may be provided a polishing liquid preparation step in which the slurry and additive liquid are mixed before the polishing step to obtain a polishing liquid. In this case, in the polishing step, the polishing liquid obtained in the polishing liquid preparation step is used to polish the inorganic insulating film, and specifically, the polishing liquid obtained in the polishing liquid preparation step is supplied between the abrasive pad of the polishing platen and the inorganic insulating film of the substrate with the inorganic insulating film pressed against the abrasive pad, while relatively moving the substrate and the polishing platen to polish at least a portion of the inorganic insulating film. In this type of polishing method, the polishing liquid may be supplied onto the abrasive pad in the polishing liquid preparation step, after conveying the slurry and additive liquid through separate tubings (liquid conveyance systems) and merging the tubings for mixture just before the supply tubing outlet to prepare the polishing liquid. The polishing liquid may also be supplied directly as a polishing liquid with the prescribed water content, or it may be supplied as a concentrate with a low water content and diluted on the abrasive pad.

When a polishing liquid set is used, in the polishing step, at least a portion of the inorganic insulating film may be polished using the polishing liquid obtained by mixing the slurry and additive liquid, while supplying each of the slurry and additive liquid between the abrasive pad and the inorganic insulating film. In this type of polishing method, the slurry and additive liquid may be supplied onto the abrasive pad through separate tubings (liquid conveyance systems). Also, the slurry and/or additive liquid may be supplied as concentrates with low water contents, and diluted on the abrasive pad.

According to this embodiment, a substrate may be polished using a slurry instead of a one-pack polishing liquid. In this case, in the polishing step, at least a portion of the inorganic insulating film is polished, in a state that the inorganic insulating film of the substrate is pressed against the abrasive pad of the polishing platen, by relatively moving the substrate and the polishing platen while supplying the slurry between the abrasive pad and the inorganic insulating film.

The polishing apparatus to be used in the polishing method of this embodiment may be, for example, a common polishing apparatus comprising a holder that holds the substrate with the film to be polished, and a polishing platen which allows attachment of an abrasive pad and mounts a motor having a variable rotational speed. Examples of such polishing apparatuses include the model EPO-111 which is polishing apparatus by Ebara Corp., and Mirra3400 and Reflection polishing machines (trade names) which are polishing apparatuses by Applied Materials.

There are no particular restrictions on the abrasive pad, and a common nonwoven fabric, foamed polyurethane pad, porous fluorine resin pad or the like may be used. The abrasive pad is preferably furrowed to allow accumulation of the polishing liquid.

The polishing conditions are not particularly restricted, but from the viewpoint of minimizing fly off of the semiconductor substrate, the rotational speed of the polishing platen is preferably a low speed of not greater than 200 rpm. The pressure (machining load) on the semiconductor substrate is preferably not greater than 100 kPa, from the viewpoint of further inhibiting formation of scratches on the polished surface. The polishing liquid is preferably continuously supplied to the surface of the abrasive pad with a pump or the like during polishing. The amount supplied is not particularly restricted, but the surface of the abrasive pad is preferably covered by the polishing liquid at all times. Preferably, the polished semiconductor substrate is thoroughly rinsed in running water, and is then dried after removing off the water droplets adhering to the semiconductor substrate using a spin dryer or the like.

EXAMPLES

The present invention will now be described in greater detail by examples, with the understanding that the invention is not limited to these examples.

Example 1

<Preparation of Slurry>

A 400 g portion of $Ce(NH_4)_2(NO_3)_6$ was dissolved in 7500 g of water to obtain a metal salt aqueous solution. Next, 210 g of ammonia water (25 mass% aqueous solution) was added to the metal salt aqueous solution at a mixing rate of 30 cc/min, and the mixture was stirred at 200 rpm to obtain a slurry comprising cerium hydroxide particles (abrasive grains). The liquid temperature of the metal salt aqueous solution and ammonia water was 25° C. Next, the slurry was subjected to solid-liquid separation by centrifugal separation to remove the liquid, then fresh water was added and ultrasonic dispersion treatment was conducted. The light transmittance for a wavelength of 500 nm was 61%/cm in the slurry (aqueous dispersion) adjusted to an abrasive grain content of 1.0 mass %. The mean particle size R1 of the secondary particles was 105 nm, as measured by a photon correlation method using the slurry adjusted to an abrasive grain content of 0.2 mass %. The pH of the slurry, as measured using a Model PH81 by Yokogawa Electric Corp., was 3.8.

<Preparation of Polishing Liquid>

A polishing liquid was prepared by mixing and stirring 60 g of the slurry with the abrasive grain content adjusted to 1 mass %, 60 g of a polyvinyl alcohol aqueous solution adjusted to 5 mass %, and 180 g of purified water. The mean particle size R2 of the secondary particles was 132 nm, as measured by a photon correlation method using this polishing liquid. The pH of the polishing liquid, as measured using a Model PH81 by Yokogawa Electric Corp., was 6.3. The polyvinyl alcohol used was a vinyl alcohol polymer with a saponification degree of 80 mol % and a mean polymerization degree of 300. The same vinyl alcohol polymer was used in the following examples and comparative examples.

<Polishing of Insulating Film>

A φ200 mm silicon wafer, with a silicon oxide ($SiO_2$) insulating film formed thereon, was set in a polishing apparatus holder mounting an adsorption pad for substrate attachment. The holder was placed on the porous urethane resin pad-mounted platen with the insulating film surface facing downward, the previously obtained polishing liquid (abrasive grain content: 0.2 mass %) was supplied onto the pad at a supplied amount of 200 cc/min, and the wafer was pressed at a polishing load of 20 kPa. Polishing was performed by 1 minute of rotation of the platen at 78 rpm and the holder at 98 rpm. The polished wafer was thoroughly washed with purified water and dried. A light-interference film thickness meter was used to measure the change in film thickness before and after polishing, and the result indicated a polishing amount of 210 nm.

<Polishing of Stopper Film>

A φ200 mm silicon wafer, with a polysilicon (p-Si) film formed thereon, was set in a polishing apparatus holder mounting an adsorption pad for substrate attachment. The holder was placed on the porous urethane resin pad-mounted platen with the insulating film surface facing downward, the previously obtained polishing liquid (abrasive grain content: 0.2 mass %) was supplied onto the pad at a supplied amount of 200 cc/min, and the wafer was pressed at a polishing load of 20 kPa. Polishing was performed by 1 minute of rotation of the platen at 78 rpm and the holder at 98 rpm. The polished wafer was thoroughly washed with purified water and dried. A light-interference film thickness meter was used to measure the change in film thickness before and after polishing, and the result indicated a polishing amount of 1.9 nm.

Example 2

<Preparation of Slurry>

A 40 g portion of $Ce(NH_4)_2(NO_3)_6$ was dissolved in 1200 g of water to obtain a metal salt aqueous solution. Next, 45 g of ammonia water (12 mass% aqueous solution) was added to the metal salt aqueous solution at a mixing rate of 20 cc/min, and the mixture was stirred at 200 rpm to obtain a slurry comprising cerium hydroxide particles (abrasive grains). The liquid temperature of the metal salt aqueous solution and ammonia water was 25° C. Next, the slurry was subjected to solid-liquid separation by centrifugal separation to remove the liquid, then fresh water was added and ultrasonic dispersion treatment was conducted. The light transmittance for a wavelength of 500 nm was 91%/cm in the slurry (aqueous dispersion) adjusted to an abrasive grain content of 1.0 mass %. The mean particle size R1 of the secondary particles was 101 nm, as measured by a photon correlation method using the slurry adjusted to an abrasive grain content of 0.2 mass %. The pH of the slurry, as measured using a Model PH81 by Yokogawa Electric Corp., was 3.6.

<Preparation of Polishing Liquid>

A polishing liquid was prepared by mixing and stirring 60 g of the slurry with the abrasive grain content adjusted to 1 mass %, 60 g of a polyvinyl alcohol aqueous solution adjusted to 5 mass %, and 180 g of purified water. The mean particle size R2 of the secondary particles was 110 nm, as measured by a photon correlation method using this polishing liquid. The pH of the polishing liquid, as measured using a Model PH81 by Yokogawa Electric Corp., was 6.4.

<Polishing of Insulating Film>

Using the previously obtained polishing liquid (abrasive grain content: 0.2 mass %), a silicon oxide insulating film and polysilicon film were subjected to polishing, washing and drying in the same manner as Example 1, and the change in film thickness before and after polishing was measured. The polishing amount of the silicon oxide film was 290 nm, and the polishing amount of the polysilicon film was 2.2 nm.

Example 3

<Preparation of Slurry>

A 200 g portion of $Ce(NH_4)_2(NO_3)_6$ was dissolved in 7500 g of water to obtain a metal salt aqueous solution. Next, 220 g of ammonia water (12 mass% aqueous solution) was added to the metal salt aqueous solution at a mixing rate of 5 cc/min, and the mixture was stirred at 500 rpm to obtain a slurry comprising cerium hydroxide particles (abrasive grains). The liquid temperature of the metal salt aqueous solution and ammonia water was 20° C. Next, the slurry was subjected to solid-liquid separation by centrifugal separation to remove the liquid, then fresh water was added and ultrasonic dispersion treatment was conducted. The light transmittance for a wavelength of 500 nm was 92%/cm in the slurry (aqueous dispersion) adjusted to an abrasive grain content of 1.0 mass %. The mean particle size R1 of the secondary particles was 72 nm, as measured by a photon correlation method using the slurry adjusted to an abrasive grain content of 0.2 mass %. The pH of the slurry, as measured using a Model PH81 by Yokogawa Electric Corp., was 3.8.

<Preparation of Polishing Liquid>

A polishing liquid was prepared by mixing and stirring 60 g of the slurry with the abrasive grain content adjusted to 1 mass %, 60 g of a polyvinyl alcohol aqueous solution adjusted to 5 mass %, and 180 g of purified water. The mean particle size R2 of the secondary particles was 78 nm, as measured by a photon correlation method using this polishing liquid. The pH of the polishing liquid, as measured using a Model PH81 by Yokogawa Electric Corp., was 6.3.

<Polishing of Insulating Film>

Using the previously obtained polishing liquid (abrasive grain content: 0.2 mass %), a silicon oxide insulating film and polysilicon film were subjected to polishing, washing and drying in the same manner as Example 1, and the change in film thickness before and after polishing was measured. The polishing amount of the silicon oxide film was 320 nm, and the polishing amount of the polysilicon film was 2.5 nm.

Comparative Example 1

<Preparation of Slurry>

A 430 g portion of Ce(NH$_4$)$_2$(NO$_3$)$_6$ was dissolved in 7300 g of water to obtain a metal salt aqueous solution. Next, 240 g of ammonia water (25 mass% aqueous solution) was added to the metal salt aqueous solution at a mixing rate of 80 cc/min, and the mixture was stirred at 200 rpm to obtain a slurry comprising cerium hydroxide particles (abrasive grains). The liquid temperature of the metal salt aqueous solution and ammonia water was 25° C. Next, the slurry was subjected to solid-liquid separation by centrifugal separation to remove the liquid, then fresh water was added and ultrasonic dispersion treatment was conducted. The light transmittance for a wavelength of 500 nm was 43%/cm in the slurry (aqueous dispersion) adjusted to an abrasive grain content of 1.0 mass %. The mean particle size R1 of the secondary particles was 115 nm, as measured by a photon correlation method using the slurry adjusted to an abrasive grain content of 0.2 mass %. The pH of the slurry, as measured using a Model PH81 by Yokogawa Electric Corp., was 3.9.

<Preparation of Polishing Liquid>

A polishing liquid was prepared by mixing and stirring 60 g of the slurry with the abrasive grain content adjusted to 1 mass %, 60 g of a polyvinyl alcohol aqueous solution adjusted to 5 mass %, and 180 g of purified water. The mean particle size R2 of the secondary particles was 163 nm, as measured by a photon correlation method using this polishing liquid. The pH of the polishing liquid, as measured using a Model PH81 by Yokogawa Electric Corp., was 6.5.

<Polishing of Insulating Film>

Using the previously obtained polishing liquid (abrasive grain content: 0.2 mass %), a silicon oxide insulating film and polysilicon film were subjected to polishing, washing and drying in the same manner as Example 1, and the change in film thickness before and after polishing was measured. The polishing amount of the silicon oxide film was 120 nm, and the polishing amount of the polysilicon film was 1.6 nm.

The synthesis conditions for the abrasive grains and the values of the properties of the slurries and polishing liquids in Examples 1-3 and Comparative Example 1 are shown in Table 1.

Figure 3:
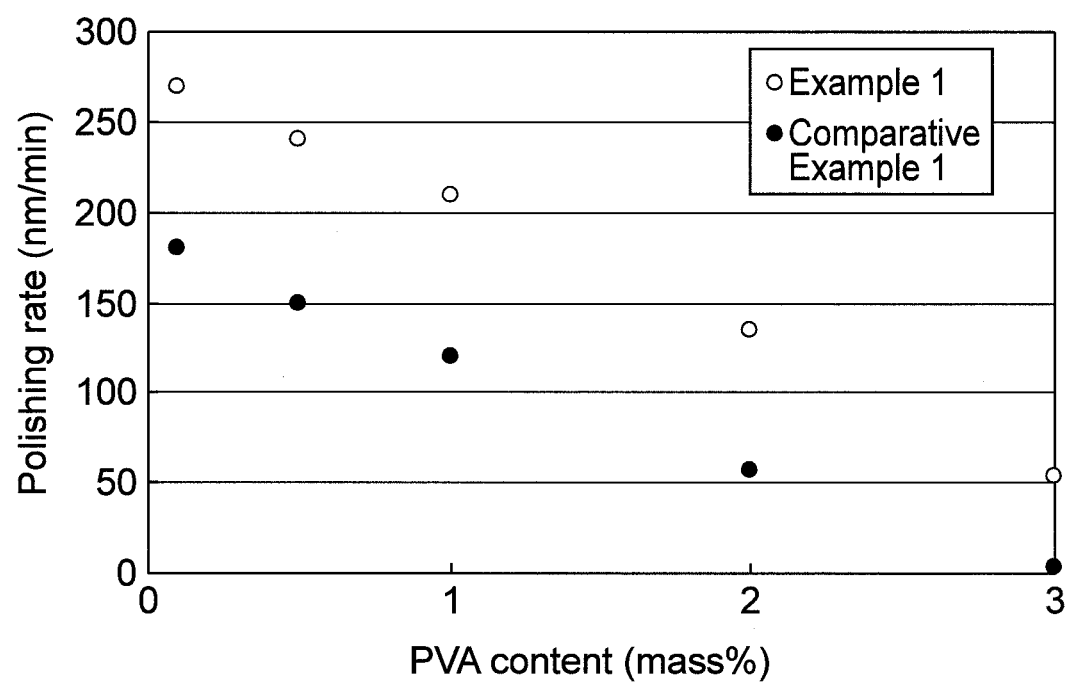
FIG. 3 is a graph showing the relationship between the content of polyvinyl alcohol (PVA) added and polishing rate.

It was then examined how the polishing rate varied when changing the polyvinyl alcohol (PVA) contents for preparation of polishing liquids, using the slurries of Example 1 and Comparative Example 1. Specifically, the polishing rates for silicon oxide films were examined in the same manner as Example 1, with polyvinyl alcohol contents of 3 mass %, 2 mass %, 1 mass %, 0.5 mass % and 0.1 mass % in the polishing liquid. The results are shown in Table 2 and FIG. 3.

TABLE 2

| | | PVA content (mass %) | | | | |
| --- | --- | --- | --- | --- | --- | --- |
| | | 3 | 2 | 1 | 0.5 | 0.1 |
| Polishing rate (nm/min) | Example 1 | 54 | 135 | 210 | 240 | 270 |
| | Comp. Ex. 1 | 3 | 57 | 120 | 150 | 180 |

As clearly shown by the results in Table 1, it was confirmed that it was easily possible to achieve both the addition effect of additive and the effect of improving polishing rate for the film to be polished, in Examples 1-3 which had light transmittances of at least 50%/cm for light with a wavelength of 500 nm. Also, as clearly shown by the results in Table 2 and FIG. 3, the polishing rate in Example 1, which had a light transmittance of at least 50%/cm for light with a wavelength of 500 nm, was higher than in Comparative Example 1 with addition of additives in the same amount, and therefore a margin exists for further addition of additives, in addition to polyvinyl alcohol. This indicates that further properties can be imparted by adding more additives in Example 1. The reason for the high polishing rate with such a high light transmittance is believed to be due to the small difference in mean particle size between the slurry and polishing liquid in the case of high light transmittance, in contrast to a tendency toward greatly increased mean particle size of the abrasive grains in the polishing liquid compared to the mean particle size of the abrasive grains in the slurry, in the case of low light transmittance.

The invention claimed is:

1. A slurry comprising abrasive grains and water,
   the abrasive grains including particles comprising a hydroxide of tetravalent cerium, the abrasive grains producing light transmittance of at least 50%/cm for

TABLE 1

| | | | Example 1 | Example 2 | Example 3 | Comp. Ex. 1 |
| --- | --- | --- | --- | --- | --- | --- |
| Synthesis conditions | Metal salt solution | Cerium salt | 400 g | 40 g | 200 g | 430 g |
| | | Water | 7500 g | 1200 g | 7500 g | 7300 g |
| | | Concentration | 0.097 mol/L | 0.061 mol/L | 0.049 mol/L | 0.107 mol/L |
| | Alkali solution | Ammonia water | 25 mol/L | 12 mol/L | 12 mol/L | 25 mol/L |
| | | | 210 g | 45 g | 220 g | 240 g |
| | Mixing speed | | 30 cc/min | 20 cc/min | 5 cc/min | 80 cc/min |
| | Stirring speed | | 200 rpm | 200 rpm | 500 rpm | 200 rpm |
| | Liquid temperature | | 25° C. | 25° C. | 20° C. | 25° C. |
| Properties | Light transmittance (%/cm) | | 61 | 91 | 92 | 43 |
| | pH of slurry | | 3.8 | 3.6 | 3.8 | 3.9 |
| | pH of polishing liquid | | 6.3 | 6.4 | 6.3 | 6.5 |
| | Secondary particle size in slurry (R1[nm]) | | 105 | 101 | 72 | 115 |
| | Secondary particle size in polishing liquid (R2[nm]) | | 132 | 110 | 78 | 163 |
| | Change rate of secondary particle size [%] | | 26 | 9 | 8 | 42 |
| | SiO$_2$ polishing rate [nm/min] | | 210 | 290 | 320 | 120 |
| | p-Si polishing rate [nm/min] | | 1.9 | 2.2 | 2.5 | 1.6 |
| | Polishing selectivity (SiO$_2$/p-Si) | | 111 | 132 | 128 | 75 | light with a wavelength of 500 nm in an aqueous dispersion with a content of the abrasive grains adjusted to 1.0 mass %.

2. The slurry according to claim 1, wherein a mean particle size of the abrasive grains is 1-150 nm.

3. The slurry according to claim 1, wherein a pH is 2.0-9.0.

4. The slurry according to claim 1, wherein a content of the abrasive grains is 0.01-15 mass % based on a total mass of the slurry.

5. The slurry according to claim 1, wherein a content of the particles comprising a hydroxide of tetravalent cerium is 0.01-10 mass % based on a total mass of the slurry.

6. The slurry according to claim 1, wherein the abrasive grains are composed of the particles comprising a hydroxide of tetravalent cerium.

7. A polishing liquid set comprising constituent components of a polishing liquid separately stored as a first liquid and a second liquid, so that the first liquid and second liquid are mixed to form the polishing liquid,
wherein the first liquid is the slurry according to claim 1, and the second liquid comprises an additive and water.

8. The polishing liquid set according to claim 7, wherein a mean particle size of the abrasive grains in the polishing liquid is 1-200 nm.

9. The polishing liquid set according to claim 7, wherein a mean particle size R1 of the abrasive grains in the first liquid and a mean particle size R2 of the abrasive grains in the polishing liquid satisfy the following formula (1).

$$|R1-R2|/R1 \times 100 \leq 30 \quad (1)$$

10. The polishing liquid set according to claim 7, wherein the additive is at least one type selected from among dispersing agents, polishing rate improvers, flattening agents and selective ratio improvers.

11. The polishing liquid set according to claim 7, wherein the additive is a vinyl alcohol polymer and/or a vinyl alcohol polymer derivative.

12. The polishing liquid set according to claim 7, wherein a content of the additive in the polishing liquid is 0.01 mass % or greater based on a total mass of the polishing liquid.

13. A polishing liquid comprising abrasive grains, an additive and water,
the abrasive grains including particles comprising a hydroxide of tetravalent cerium, the abrasive grains producing light transmittance of at least 50%/cm for light with a wavelength of 500 nm in an aqueous dispersion with a content of the abrasive grains adjusted to 1.0 mass %.

14. The polishing liquid according to claim 13, wherein a content of the particles comprising a hydroxide of tetravalent cerium is 0.01-8 mass % based on a total mass of the polishing liquid.

15. The polishing liquid according to claim 13, wherein a mean particle size of the abrasive grains is 1-200 nm.

16. The polishing liquid according to claim 13, wherein a pH is 3.0-9.0.

17. The polishing liquid according to claim 13, wherein the additive is at least one type selected from among dispersing agents, polishing rate improvers, flattening agents and selective ratio improvers.

18. The polishing liquid according to claim 13, wherein the additive is a vinyl alcohol polymer and/or a vinyl alcohol polymer derivative.

19. The polishing liquid according to claim 13, wherein a content of the additive is 0.01 mass % or greater based on a total mass of the polishing liquid.

20. A substrate polishing method comprising:
a step of placing a film to be polished, of a substrate which has the film to be polished on its surface, so as to face an abrasive pad, and
a step of polishing at least a portion of the film to be polished while supplying the polishing liquid according to claim 13 between the abrasive pad and the film to be polished.

21. A substrate polishing method comprising:
a step of placing a film to be polished, of a substrate which has the film to be polished on its surface, so as to face an abrasive pad,
a step of mixing the first liquid and second liquid of the polishing liquid set according to claim 7 to obtain the polishing liquid, and
a step of polishing at least a portion of the film to be polished while supplying the polishing liquid between the abrasive pad and the film to be polished.

22. A substrate polishing method comprising:
a step of placing a film to be polished, of a substrate which has the film to be polished on its surface, so as to face an abrasive pad, and
a step of polishing at least a portion of the film to be polished while supplying both the first liquid and second liquid of the polishing liquid set according to claim 7 between the abrasive pad and the film to be polished.

23. A substrate polishing method comprising:
a step of placing a film to be polished, of a substrate which has the film to be polished on its surface, so as to face an abrasive pad, and
a step of polishing at least a portion of the film to be polished while supplying the slurry according to claim 1 between the abrasive pad and the film to be polished.

24. The slurry according to claim 1, wherein a pH is 3.0-6.0, and a mean particle size of the abrasive grains is 5-120 nm.

25. The polishing liquid according to claim 13, wherein a pH is 5.0-8.0, and a mean particle size of the abrasive grains is 15-150 nm.

* * * * *